United States Patent
Lee et al.

(10) Patent No.: US 7,687,779 B2
(45) Date of Patent: Mar. 30, 2010

(54) ELECTRO-MEDICAL IMAGING APPARATUS HAVING CHALCOGEN-THIN FILM TRANSISTOR ARRAY

(75) Inventors: Sang Su Lee, Daejeon (KR); Kobong Song, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 83 days.

(21) Appl. No.: 12/023,822

(22) Filed: Jan. 31, 2008

(65) Prior Publication Data

US 2008/0217547 A1 Sep. 11, 2008

(30) Foreign Application Priority Data

Mar. 9, 2007 (KR) .................... 10-2007-0023588

(51) Int. Cl.
*H01L 29/18* (2006.01)
*H01L 27/146* (2006.01)

(52) U.S. Cl. .................. 250/370.09; 257/42; 438/95; 438/102

(58) Field of Classification Search ............ 250/370.09; 257/42; 438/95, 102
See application file for complete search history.

(56) References Cited

U.S. PATENT DOCUMENTS 4,940,604 A * 7/1990 Suyama et al. ............. 427/76
(Continued)

FOREIGN PATENT DOCUMENTS

KR 1020010048866 6/2001
(Continued)

OTHER PUBLICATIONS

ETRI, "GST-based switching elements using laser annealing," Photonics Conference 2006/TP14, pp. 120-121 (2006).

(Continued)

*Primary Examiner*—David P Porta
*Assistant Examiner*—Jessica L Eley
(74) *Attorney, Agent, or Firm*—Lahive & Cockfield, LLP; EuiHoon Lee, Esq.

(57) ABSTRACT

Provided is an electro-medical imaging apparatus manufactured using a thin film transistor (TFT) array including chalcogen-based semiconductor elements that can generate and store an electric signal from an X-ray signal so as to be able to replace a traditional film type X-ray reader. The electro-medical imaging apparatus includes: a signal generating unit where electron-hole pairs are formed by absorbing an optical energy irradiated from outside; a power source connected to a surface of the signal generating unit and applies an electric signal so as to separate the electron-hole pairs to be accumulated each in opposite sides of the signal generating unit according to their polarities; a signal storage unit that is in contact with the signal generating unit and receives and stores one of the separated charges; and a signal converter that is in contact with the signal storage unit and applies a control signal to the signal storage unit in order to convert an electric signal, which generated by the charges stored in the signal storage unit, into an image signal. The signal generating unit may use amorphous selenium (a-Se), which is one of chalcogen materials, or CdTe or CdZnTe which is a compound material using chalcogen. Also, the signal storage unit may include a TFT array including $Ge_2Sb_2Te_5$ (GST) or a TFT array including $CuInSe_2$ (CIS).

18 Claims, 4 Drawing Sheets

U.S. PATENT DOCUMENTS

| | | | |
|---|---|---|---|
| 5,385,806 A * | 1/1995 | Ohno et al. | 430/270.13 |
| 6,232,607 B1 * | 5/2001 | Huang | 250/370.09 |
| 6,399,950 B1 * | 6/2002 | Kimura et al. | 250/370.09 |
| 2002/0113250 A1 * | 8/2002 | Chaiken et al. | 257/200 |
| 2005/0170074 A1 * | 8/2005 | Isoda | 427/65 |
| 2006/0204659 A1 * | 9/2006 | Choi | 427/248.1 |
| 2008/0217610 A1 * | 9/2008 | Lee et al. | 257/42 |

FOREIGN PATENT DOCUMENTS

| | | |
|---|---|---|
| KR | 1020030029463 | 4/2003 |
| KR | 1020030031924 | 4/2003 |
| KR | 1020070046687 | 5/2007 |

OTHER PUBLICATIONS

ETRI, Optical Information Processing Technology Workshop, pp. 63-65 (2006).

* cited by examiner

⊖ ELECTRON
⊕ HOLE

ELECTRO-MEDICAL IMAGING APPARATUS HAVING CHALCOGEN-THIN FILM TRANSISTOR ARRAY

CROSS-REFERENCE TO RELATED PATENT APPLICATION

This application claims the benefit of Korean Patent Application No. 10-2007-0023588, filed on Mar. 9, 2007, in the Korean Intellectual Property Office, the disclosure of which is incorporated herein in its entirety by reference.

BACKGROUND OF THE INVENTION

1. Field of the Invention

The present invention relates to an electro-medical imaging apparatus, and more particularly, to an electro-medical imaging apparatus that can convert a light signal into an electric digital signal using a thin film transistor (TFT) including chalcogen-based semiconductor elements.

2. Description of the Related Art

X-ray scanning apparatus are used in various medical examinations, for example, examinations to determine a fracture of a bone or damage to internal organs. Generally, X-ray imaging is performed by irradiating x-rays onto a medium, for example, a human body, and exposing an x-ray film with images formed according to the changes of the penetrating x-ray intensities because of penetrating, refracting, or reflecting the x-ray by the human body. The x-ray film is expensive and disposable and the method using the x-ray film should employ physical means for enlarging, and storing images, thereby being costly in terms of space and time. Furthermore, the use of the disposal x-ray films has additional problems such as squandering of resources and environmental pollution.

SUMMARY OF THE INVENTION

The present invention provides an electro-medical imaging apparatus manufactured using a thin film transistor (TFT) array including chalcogen-based semiconductor elements that can generate and store an electric signal from an X-ray signal so as to be able to replace a traditional film type X-ray reader.

According to an aspect of the present invention, there is provided an electro-medical imaging apparatus including: a signal generating unit where electron-hole pairs are formed by absorbing an optical energy irradiated from outside; a power source contacting a surface of the signal generating unit and applying an electric signal so as to separate the electron-hole pairs to be accumulated each in opposite sides of the signal generating unit according to their polarities; a signal storage unit connected to the signal generating unit and receiving and storing one of the separated charges; and a signal converter connected to the signal storage unit and applying a control signal to the signal storage unit to convert an electric signal, generated by the charges stored in the signal storage unit into an image signal.

The signal generating unit, the signal storage unit, and the signal converter may be a structure having sequentially stacked layers.

The signal generating unit may include a first electrode electrically connected to the power source so that the electric signal of the power source is applied to the signal generating unit; an insulating layer formed in a lower surface of the first electrode and blocking charges flowing from the power source; and an absorption layer formed in a lower surface of the insulating layer and absorbing an optical energy irradiated from outside to generate electron-hole pairs, wherein the electron-hole pairs are separated from each other by the electric signal applied from the power source to be accumulated each in opposite sides.

The absorption layer may include chalcogen. The absorption layer may include pure amorphous selenium (Se), CdTe, or CdZnTe.

The signal storage unit may include: a blocking layer allowing the inflow of only one kind of charge separated in the signal generating unit; a second electrode electrically contacting the blocking layer; a device layer electrically contacting the second electrode and including a plurality of unit cells, each of which consists of a capacitor and a transistor connected to the capacitor, wherein the capacitor stores one kind of charge that inflows through the blocking layer; and a substrate where the blocking layer, the second electrode, and the device layer are formed.

The substrate may include glass or quartz.

The unit cell may further include one or more electrical unit devices.

The device layer may include two-dimensional arrays in which a plurality of the unit cells are arranged in horizontal and vertical directions, respectively.

The transistor disposed in the device layer may include: an active layer formed with chalcogen material on the substrate; source and drain electrodes respectively formed at both sides of the active layer; a gate insulating layer formed on the active layer; and a gate electrode formed on the gate insulating layer. The chalcogen material in the active layer may include $Ge_2Sb_2Te_5$ (GST) or $CuInSe_2$ (CIS).

The transistor disposed in the device layer may include: a gate electrode formed on a portion of the substrate; an insulating layer covering the substrate and the gate electrode; an active layer formed with chalcogen material on the insulating layer so as to cover a region where the gate electrode is formed; and source and drain electrodes respectively formed at both sides of the active layer. The chalcogen material in the active layer may include $Ge_2Sb_2Te_5$ (GST) or $CuInSe_2$ (CIS).

The active layer may be formed with $In_2Se_3$ and $Cu_2Se_3$, respectively.

The conductive type of the active layer may be determined according to a relative mole ratio of $In_2Se_3$ and $Cu_2Se_3$. When the relative mole ratio of $In_2Se_3$ and $Cu_2Se_3$ is in a range of 0.1 to 0.5, the CIS film may have a p-type conductivity. On the other hand, when the relative mole ratio of $In_2Se_3$ and $Cu_2Se_3$ is in a range of 0.6 to 0.9, the CIS film may have an n-type conductivity.

The signal converter may include: a signal applying circuit unit applying a control signal to a transistor in the signal storage unit; a signal amplification device amplifying an electric signal transmitted from the transistor generated by the control signal; a multiplexer multiplexing the signal amplified in the signal amplification device; and an analog-to-digital converter (ADC) converting the multiplexed signal into a digital signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. It will also be understood that when a layer is referred to as being "on" another layer or substrate, it can be directly on the other layer or substrate, or intervening elements may also be present. In the drawings, the thicknesses sizes of layers and regions are exaggerated for clarity. Like reference numerals in the drawings denote like elements, and thus their description will be omitted. The words "and/or" used in the present invention includes any and all combinations of one or more of the associated listed items.

Also, although terms like a first and a second are used to describe various elements, components, regions, layers, and/or portions in various embodiments of the present invention, the elements, components, regions, layers, and/or portions should not be limited by these terms. These terms are only used to distinguish one element, component, region, layer, or portion from another. Therefore, a first element, component, region, layer, or portion discussed below could be termed a second element, component, region, layer, or portion without departing from the teachings of the present invention.

The present invention includes electronic components, for example, a TFT, using chalcogen material of group VIB in the periodic table. Related technologies related to the above TFT will now be described.

[Related Technology 1]

Lee Sang Soo, Kim Kyoung Am, Song Ki Bong, Jo Doo Hee, Seo Jung Dae, "Development of switching device based on GST thin film using laser annealing", Photonics Conference, 2006.

In the description of the related technology 1, a p+–p–p+ type MOS-type TFT, which is formed on a single thin film including $Ge_2Sb_2Te_5$ (GST) by a laser annealing, is described. A current-voltage characteristic of the device disclosed in the above description of the related technology 1 has a similar switching performance compared with a conventional transistor. In particular, in an embodiment of the present invention, the TFT described in the above description of the related technology 1 can be included in a signal storage unit.

[Related Technology 2]

Kim Kyoung Am, Jo Gyu Man, Song Ki Bong, "Manufacture and characteristics of light thin film type transistor with $CuInSe_2$", light information processing technology workshop, p 63-65, 2006.

In the description of the related technology 2, a p-n junction is formed with $CuInSe_2$ (CIS) and InSe that are widely used in solar batteries, and the design and manufacture of a TFT device using this p-n junction, having an excellent light sensitivity, are described. In particular, in an embodiment of the present invention, the TFT described in the above description of the related technology 2 can be included in a signal storage unit.

[Related Technology 3]

Song Ki Bong, etc., Korean patent application No. 2005-124174, U.S. patent application Ser. No. 1/481,599, "Chalcogen Photo-TFT including chalcogenide-based elements"

In the description of the related technology 3, a method of manufacturing a TFT having a MOS structure with chalcogen elements are described. A current-voltage characteristic of a TFT device manufactured by the above method distinctively varies due to the light irradiation. In particular, in an embodiment of the present invention, the TFT described in the above description of the related technology 3 can be included in a signal storage unit.

Figure 1:
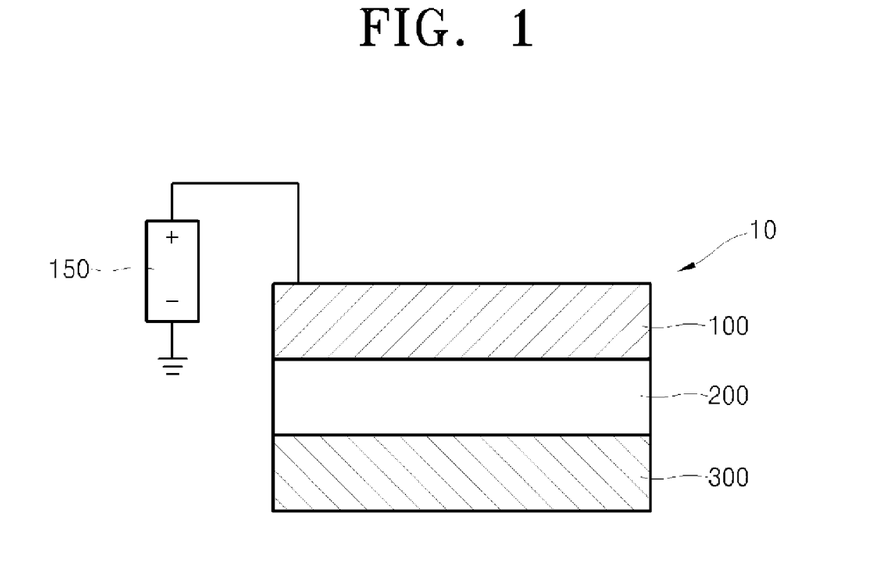
FIG. 1 is a schematic cross-sectional view illustrating a structure of an electro-medical imaging apparatus according to an embodiment of the present invention.

FIG. 1 is a schematic cross-sectional view illustrating a structure of an electro-medical imaging apparatus 10 according to an embodiment of the present invention.

Referring to FIG. 1, the electro-medical imaging apparatus 10 includes a signal generating unit 100, a power source 150 in contact with a surface of the signal generating unit 100 for applying an electric signal, a signal storage unit 200 in contact with the signal generating unit 100, and a signal converter 300 in contact with the signal storage unit 200. As shown in FIG. 1, the signal generating unit 100, the signal storage unit 200, and the signal converter 300 may be sequentially stacked in the above described order, or in the inverse order, that is the stacking order of the signal converter 300, the signal storage unit 200, and the signal generating unit 100. Details about structures and operations of the signal generating unit 100, the signal storage unit 200, and the signal converter 300 will be separately described.

Figure 2:
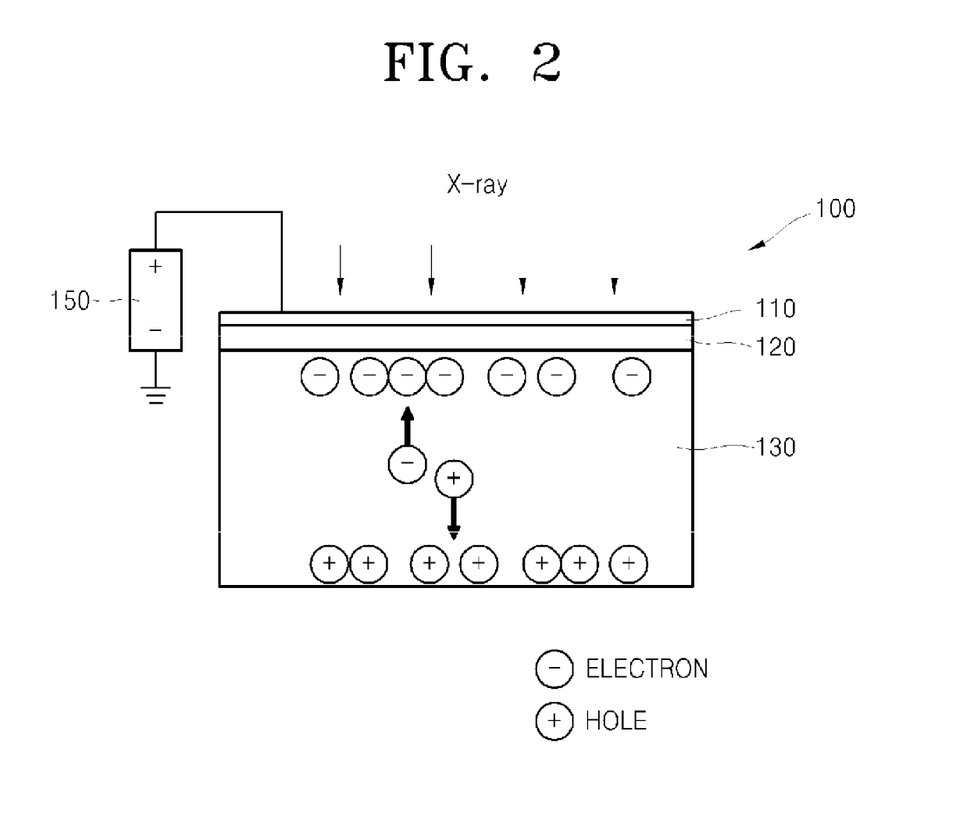
FIG. 2 is a schematic cross-sectional view of a signal generating unit of FIG. 1.

FIG. 2 is a schematic cross-sectional view of the signal generating unit 100 of FIG. 1.

Referring to FIG. 2, the signal generating unit 100 includes a first electrode 110, an insulating layer 120, and an absorption layer 130. The first electrode 110 is connected to a power source 150 applying an electric signal to the signal generating unit 100. The insulating layer 120 is formed under the first electrode 110 and blocks electron-hole pairs that enter the signal generating unit 100 from outside. For example, the insulating layer 120 prevents the electrons or holes that have entered the first electrode 110 due to the electric signal applied from the power source 150, from migrating into the absorption layer 130 formed under the insulating layer 120. However, the insulating layer 120 allows an external electric field due to the electric signal, which is applied from the power source 150, to affect the absorption layer 130. Such a principle is similar to that of a conventional capacitor.

The absorption layer 130 absorbs light irradiated from outside, for example, X-rays. Therefore, first electrode 110 and the insulating layer 120 should have appropriate materials or structures so that the light radiated from outside, for example, X-rays, can be transmitted. Accordingly, when light, for example, X-rays, are irradiated onto the signal generating unit 100 of the electro-medical imaging apparatus 10, the absorption layer 130 generates electron-hole pairs by absorbing the optical energy. The absorption layer 130 may include pure amorphous selenium (Se), or may include a compound including group VIB in the periodic table, for example, CdTe or CdZnTe.

The electron-hole pairs generated by the light irradiation in the absorption layer 130 are separated from each other by the electric signal applied to the first electrode 110 from the power source 150 and move to an upper portion and a lower portion of the absorption layer 130, respectively. For example, when an anode(+) of the power source 150 is connected to the first electrode 110, the electrons in the absorption layer 130 move upward in the absorption layer 130, and the holes move downward in the absorption layer 130. This movement of the electrons and the holes is illustrated in FIG. 2.

Figure 3:
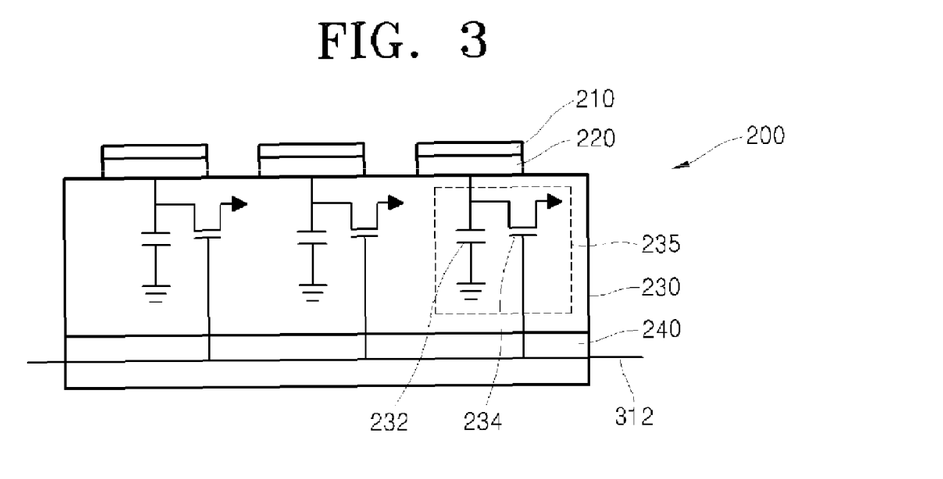
FIG. 3 is a schematic cross-sectional view of the signal storage unit of FIG. 1.

FIG. 3 is a schematic cross-sectional view of the signal storage unit 200 of FIG. 1.

Referring to FIG. 3, the signal storage unit 200 includes a blocking layer 210, a second electrode 220, and a device layer 230. The blocking layer 210, the second electrode 220, and the device layer 230 can be stacked on a substrate 240 using a conventional stacking method. The substrate 240 may be made of a transparent material, for example, glass or quartz. In order to clarify characteristics of the present invention, roles of the blocking layer 210, the second electrode 220, and the device layer 230 will be mainly described.

Referring to FIG. 1, the signal storage unit 200 may be positioned under the signal generating unit 100. That is, the blocking layer 210 formed in an uppermost portion of the signal storage unit 200 is positioned under the absorption layer 130 formed in a lowermost portion of the signal generating unit 100. One or more third layers, which provide different functions, may be further formed between the blocking layer 210 and the absorption layer 130. The blocking layer 210 blocks one kind of charge, formed by absorbing optical energy, for example, X-ray energy in the absorption layer 130 of the signal generating unit 100 and separated by the electric signal applied by the power source 150, from entering the signal storage unit 200. The blocking layer 210 allows the other kind of charge of the electron-hole pairs, to enter the signal storage unit 200. For example, the blocking layer 210 may prevent electrons from entering the signal storage unit 200 and allow only holes to enter. Conversely, the blocking layer 210 may prevent the holes from entering the signal storage unit 200 and allow the electrons to enter. The second electrode 220 is formed to electrically connect the blocking layer 210 and the device layer 230. Charges, for example, holes, which have entered through the blocking layer 210, are stored in a capacitor 232 of the device layer 230 through the second electrode 220.

Referring to FIG. 3, the signal storage unit 200 has the blocking layer 210 and the second electrode 220 protruding from a surface of the device layer 230, and a portion of the device layer 230 being exposed. However, it is only an example, and the present invention is not limited thereto. That is, a structure such as a conventional device isolation layer is formed to fill the exposed regions of the device layer 230 where the blocking layer 210 and the second electrode 220 are not formed, thereby forming plateau with the same level of the uppermost surface of the blocking layer 210.

The device layer 230 includes a plurality of unit cells 235 formed on the substrate 240. The unit cell 235 shown with a dotted line in FIG. 3 includes a single capacitor 232 and a single transistor 234. However, it is only an example, and the present invention is not limited thereto. That is, the unit cell 235 may further include electrical device units such as a transistor, a capacitor, or a resistor. The transistor 234 may be a thin film transistor (TFT). The transistor 234 may be a thin film transistor having $Ge_2Sb_2Te_5$ (GST) or $CuInSe_2$ (CIS). The method of forming the transistor 234 will now be described later in detail. The above-described unit cells 235 may be arranged horizontally and vertically on the plane of the substrate 240 to form two-dimensional arrays. The above-described two-dimensional arrays are not limited to the unit cells 235 being necessarily formed on the same plane.

As described above, charges, for example, holes, stored in the capacitor 232 through the second electrode 220 are transmitted to the signal converter 300 which is positioned under the signal storage unit 200 through the transistor 234 which is switched by a control signal.

Figure 4:
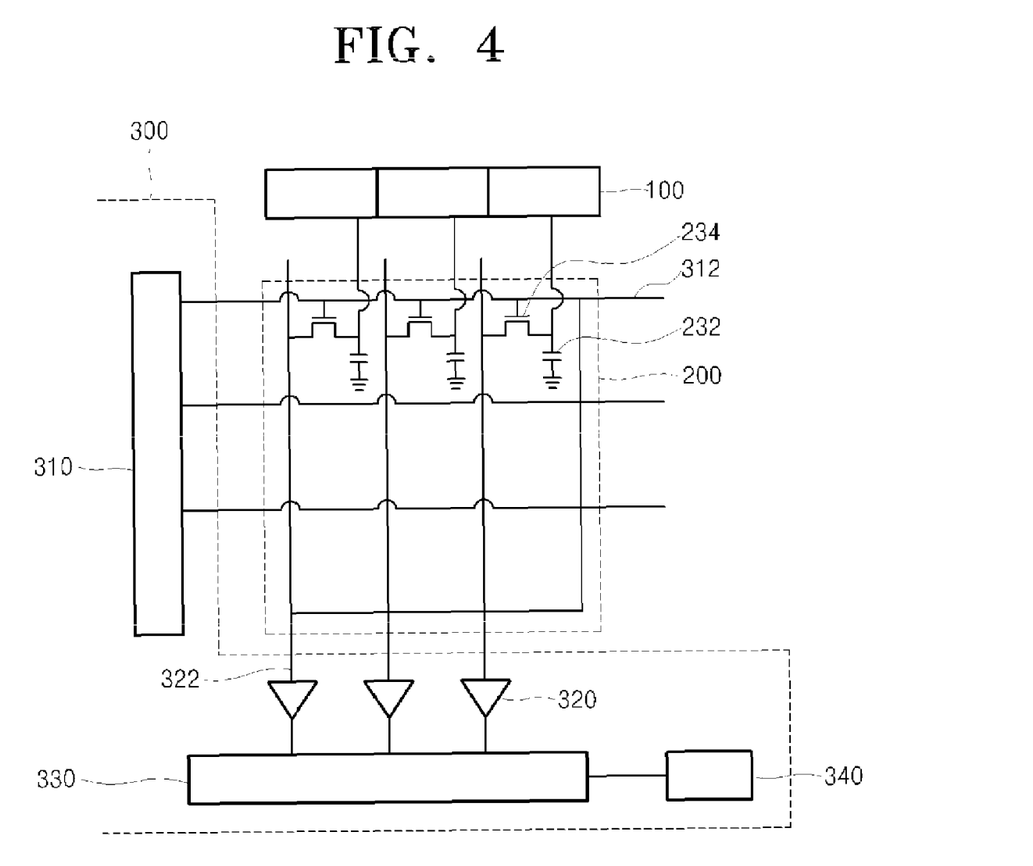
FIG. 4 is a circuit diagram illustrating the connection between a signal storage unit and a signal converter of FIG. 1.

FIG. 4 is a circuit diagram illustrating the connection between the signal storage unit 200 and a signal converter 300 of FIG. 1.

Referring to FIG. 4, the signal converter 300 includes a signal applying circuit unit 310 applying a control signal to the unit cell 235, for example the transistor 234 in the signal storage unit 200, a signal amplification device 320 amplifying an electric signal transmitted through the transistor 234 by the control signal in an appropriate size, a multiplexer 330 multiplexing a signal output from the signal amplification device 320, and an analog-to-digital converter (ADC) 340 converting the multiplexed signal into a digital signal.

Referring to FIG. 4, operations of the signal converter 300 will now be described. The signal applying circuit unit 310 applies respectively control signals to the transistors 234 in the transistor array of the signal storage unit 200 through a first line 312, and transmits charges, for example, holes, stored in the capacitor 232 each corresponding to the transistor 234, to the signal amplification device 320 through a second line 322. The first line 312 can function similar to a conventional address line, and the second line 322 can function similar to a bit line. The signal amplification device 320 amplifies the transmitted electric signal in an appropriate size and transmits the amplified signal to the multiplexer 330. The multiplexer 330 transmits the amplified signal to the ADC 340. The ADC 340 converts the transmitted electric signal to an image signal, that is, encordingan analog signal to a digital signal, thereby transmitting the converted signal to an output apparatus (not shown), for example, a display apparatus, a printing apparatus, a storing apparatus, or the like.

Also, the ADC 340 may include a digital signal processor (DSP). The above-described analog signal is processed by the DSP and may be transmitted to the output device. The DSP is both a central processing unit (CPU) manufactured for processing digital signals and a microprocessor manufactured for digitally processing analog signals at high speed. Although, a conventional microprocessor can process only digital signals, the DSP includes various devices in order to process an analog signal at high speed. For example, the DSP may include a multiplier and a floating point unit (FPU) implemented by a hardware design. Also, the DSP may include an analog input/output port inside a chip so as to directly process an analog signal. Therefore, to emphasize that high speed analog signals can be processed, the DSP, which is a sort of microprocessor, is discriminatively called against a conventional micro processor which can process only digital signal. Methods of using and programming of the DSP are similar to the conventional microprocessor. However, the DSP has a characteristic in which each command is patched, analyzed and moved. The most distinguishing characteristic of the DSP is that high speed operations can be performed in real-time. In particular, the DSP can be used in digital signal processing that requires complex counting and floating-point arithmetic operations. In the DSP, more than one command can be performed in one clock, and a reduced instruction set computer (RISC) design and Harvard-architecture are used to process commands at high speed. Also, in order to increase command processing efficiency, the DSP includes many resistors and has a structure in which most operations are performed centering on the resistors. Also, the DSP includes a two-stage memory structure, and this accordingly further increases processing speed.

Hereinafter, a method of manufacturing the transistor 234 included in the signal storage unit 200 will be described. As described above, the transistor 234 may include chalcogen elements. For example, the transistor 234 may be a TFT including $Ge_2Sb_2Te_5$ (GST) or $CuInSe_2$ (CIS). Also, the transistor 234 may be a transistor formed by applying a TFT and a method of manufacturing the same, which are described in relation to the related technologies 1 through 3.

Hereinafter, a normal staggered type TFT including GST and a method of manufacturing the same, and an inverted staggered type TFT including CIS and a method of manufacturing the same will be described as examples which can be applied to the transistor 234. However, these are only examples, and the present invention is not limited thereto. Therefore, the normal staggered type TFT including CIS and the inverted staggered type TFT including GST can be realized by the following manufacturing methods and it is obviously included in the scope of the present invention. The normal staggered type TFT includes a gate electrode formed on a photoconductive layer with respect to a substrate. On the other hand, the inverted staggered type TFT includes the photoconductive layer formed on the gate electrode with respect to the substrate.

Figure 5:
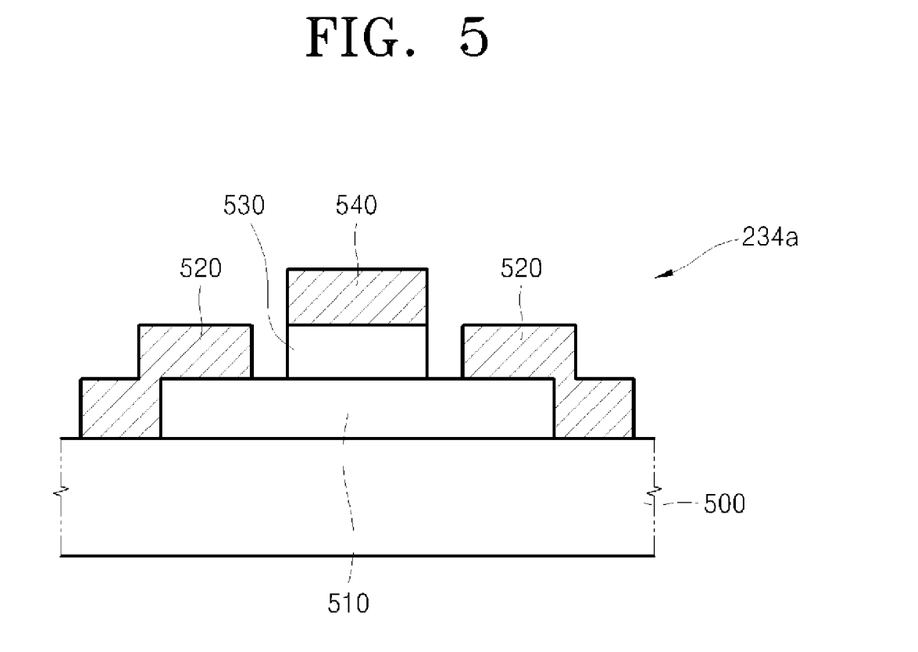
FIG. 5 is a cross-sectional view illustrating a normal staggered type thin film transistor (TFT) formed in the signal storage unit of FIG. 1.

FIG. 5 is a cross-sectional view illustrating a normal staggered type TFT 234a formed in the signal storage unit of FIG. 1.

Referring to FIG. 5, in the normal staggered type TFT 234a, an active layer 510 is formed on a substrate 500. The substrate 500 may be made of a transparent material, for example, glass or quartz. In particular, the glass substrate is appropriate for a low temperature process because the following elements of the present invention are made of materials which do not need a high temperature process. Also, the glass is transparent, thereby being appropriate for manufacturing a device that uses light.

It will be understood by those of ordinary skill in the art that the following layers formed on the substrate 500 can be formed using the above-described conventional deposition and patterning methods. Therefore, their explanation will be omitted herein in order to clearly and simply describe characteristics of the present invention.

The active layer 510 is a layer where a channel is formed between a source and a drain, and is formed of a GeTe—$Sb_2Te_3$ (GST) layer including a chalcogenide element. Since the GST layer has an extremely high photoconductive efficiency, the GST is also called a photoconductive layer. That is, the photoconductive layer is a photoconductive thin film generating a photoelectric current by responding to light and absorbing light. The GST layer can be formed of a thin film in which a phase can be changed from an amorphous state to a crystalline state, or vice-versa.

Source/drain electrodes 520 are formed on the substrate 500 to connect the active layer 510. For example, the source/drain electrodes 520 may be a metal layer including gold (Au) or aluminum (Al). A gate insulating layer 530 is formed on the active layer 510. The gate insulating layer 530 may be made of a chalcogenide-based insulating layer such as an $As_2S_3$ layer or an organic material layer, for example, may be a transparent polymethyl methacrylate (PMMA) layer. The gate insulating layer 530 maintains good contact with the GST layer consisting of the active layer 510, and does not change the characteristic of the GST layer during the manufacturing process.

A gate electrode 540, which controls ON/OFF of a photoelectric current being supplied to the photoconductive layer 510, is formed on the gate insulating layer 530. For example, the gate electrode 540 may be a metal layer including Au or Al. In general, the metal layer in the gate electrode 540 or the source/drain electrodes 520 is opaque. However, it may also be a transparent metal layer.

As described above, CIS may be used as a material for forming the photoconductive layer 510 instead of GST. The photoconductive layer 510 may include a composite layer of an n-type CIS layer and a p-type CIS layer which are formed by the method described below.

Figure 6:
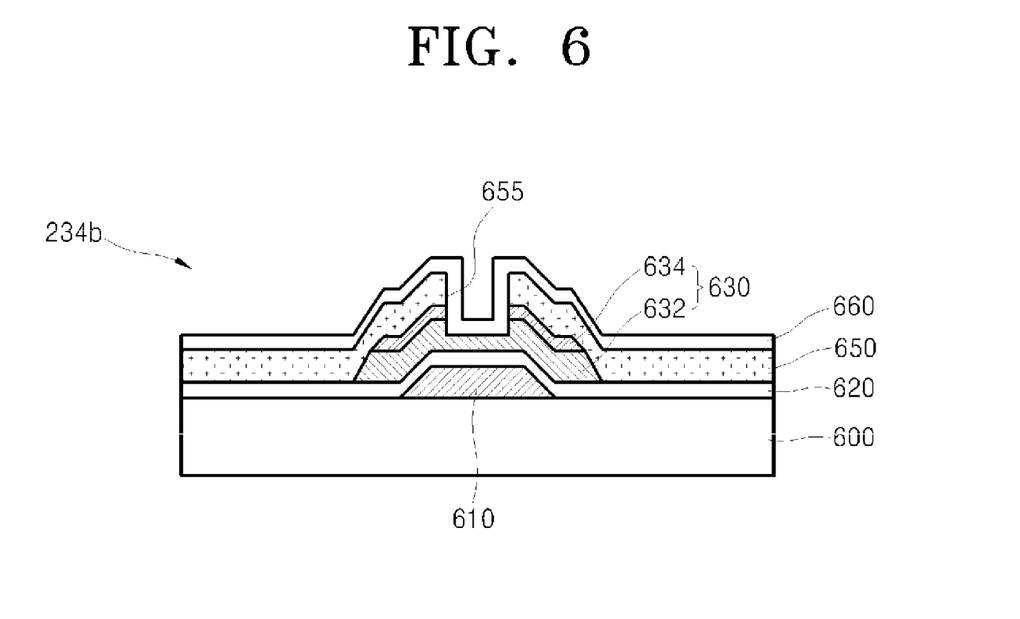
FIG. 6 is a cross-sectional view illustrating an inverted staggered type TFT formed in the signal storage unit of FIG. 1.

FIG. 6 is a cross-sectional view illustrating an inverted staggered type TFT 234b formed in the signal storage unit of FIG. 1.

It will be understood by those of ordinary skill in the art that the following layers formed on the substrate 600 can be formed using the above-described conventional deposition and patterning methods. Therefore, their explanation will be omitted herein in order to clearly and simply describe characteristics of the present invention.

Referring to FIG. 6, a gate electrode 610 is formed on a substrate 600. The substrate 600 may be made of a transparent material such as glass or quartz. The gate electrode 610 may be formed by depositing a conductive material, such as conductive polysilicon, indium-tin oxide (ITO), metal such as Au and Al, or the like.

An insulating layer 620 is formed on an exposed region of the gate electrode 610 and the substrate 600. For example, the insulating layer 620 may be made of silicon oxide ($SiO_2$) or an organic material polymer such as polymethyl methacrylate (PMMA) The insulating layer 620 may be in good contact with the gate electrode 610 and an active layer 630, formed later with CIS. Therefore, the insulating layer 620 may be formed of $SiO_2$. A thickness of the insulating layer 620 may be in a range of 2000 Å to 5000 Å. However, the material and the thickness of the insulating layer 620 are exemplarily, and the present invention is not limited thereto.

The active layer 630 including CIS is patterned on the insulating layer 620. In FIG. 6, a plurality of active layers 630 are of different conductive types. However, it is exemplarily, and the present invention is not limited thereto. That is, the active layer 630 may not be a conductive type, or may be an n-type or p-type conductive type. A first conductive type active layer 632 may be an n-type and a second conductive type active layer 634 may be a p-type, or vice-versa. A method of forming the active layer 630, and in particular, a method of forming the active layer 630 that is of a predetermined conductive type, will now be described in detail.

A conductive layer 650 covering the active layer 630 and the exposed insulating layer 620 is formed on the substrate 600. The conductive layer 650 may be formed by depositing a conductive material, for example, conductive polysilicon, ITO, metal such as Au, and Al, or the like. A thickness of the conductive layer 650 may be in a range of 500 Å to 4000 Å. However, the material and the thickness of the conductive layer 650 are exemplarily, and the present invention is not limited thereto. A trench 655 corresponding to the gate electrode 610 is formed in order to expose the active layer 630. The conductive layer 650 is separated by the trench 655 so as to form the source/drain electrodes 650.

The active layer 630 is a layer where an electrical channel is formed. Similarly to a conventional transistor, the channel is formed by applying voltage to a gate electrode. In the TFT 234b using the CIS, the channel may be formed by irradiating light onto the active layer 630. This is caused by an excellent light sensitivity of CIS. In other words, the active layer 630 absorbs a light energy to generate and move electron-hole pairs, thereby decreasing an electrical resistance between source/drain electrodes 650. As described above, GST may be used as material for forming the active layer 630, instead of CIS.

The TFT 234b may further include a passivation layer 660 covering the inside of the source and drain electrodes 650 and the trench 655.

Hereinafter, a method of forming the active layer 630 including CIS, as illustrated in FIG. 6, will be described in detail.

Figure 7:
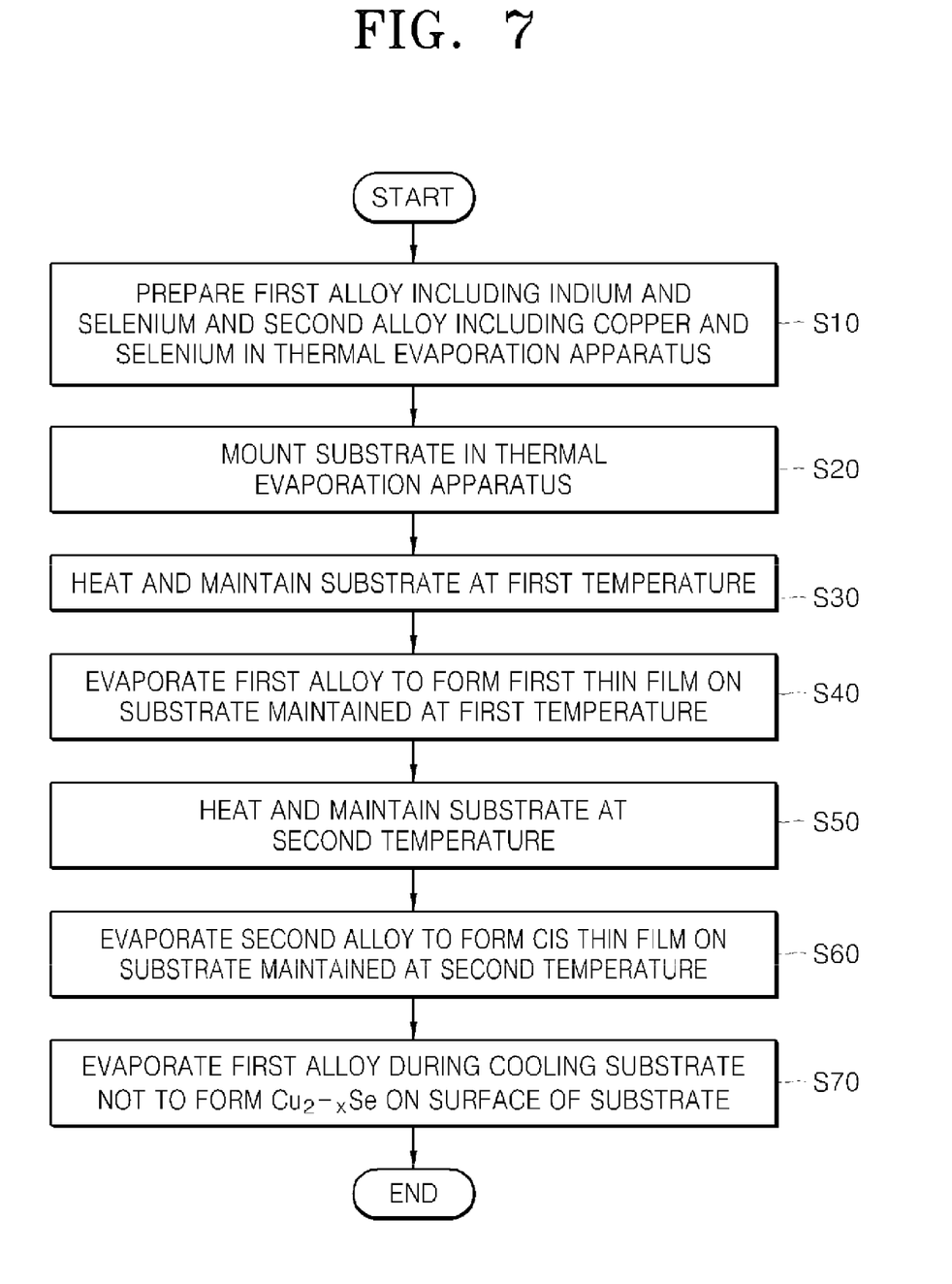
FIG. 7 is a flowchart illustrating a method of manufacturing a $CuInSe_2$ (CIS) active layer according to an embodiment of the present invention.

FIG. 7 is a flowchart of a method of manufacturing an active layer 630 including CIS according to an embodiment of the present invention.

Referring to FIG. 7, a first alloy including indium (In) and selenium (Se) and a second alloy including copper (Cu) and Se are prepared in a thermal evaporation apparatus having a conventional tungsten (W) boat (Operation S10). For example, the first alloy may be $In_2Se_3$ and the second alloy may be $Cu_2Se_3$. However, this is exemplarily, and the present invention is not limited thereto. Then, a substrate is formed in the thermal evaporation apparatus (Operation S20).

Next, the substrate is heated and maintained at a first temperature (Operation S30). In order to form a first thin film on the substrate maintained at the first temperature, the first alloy is evaporated (Operation S40). The first temperature may be in a range of 150° C. to 350° C. Accordingly, a thin film including the first alloy, for example, $In_2Se_3$, may be formed on the substrate.

Then, the substrate is heated and maintained at a second temperature (Operation S50). In order to form a thin film including a $CuInSe_2$ (CIS) thin film on the substrate, the second alloy is evaporated (Operation S60). The second temperature may be the same as the first temperature or may be higher than the first temperature. For example, the second temperature may be in a range of 400° C. to 550° C. However, this is exemplarily, and the present invention is not limited thereto. As described above, the second alloy may be $Cu_2Se_3$. Accordingly, the evaporated second alloy reacts with the first alloy to form a CIS thin film, that is, the active layer 630, on the substrate where the thin film including the first alloy, for example, the $In_2Se_3$ thin film.

Next, the first alloy is evaporated again while the substrate is cooled (Operation S70), which is an optional process for preventing $Cu_{2-x}$—Se from being formed on a surface of the substrate. At this time, the amount of the first alloy, which is evaporated again, is much less than the amount of the first alloy which is evaporated in the formal process. By performing the above process, a thin n-type CIS and/or a p-type CIS thin film, which are/is appropriate for a thin film type transistor and a light thin film type transistor, are/is formed. However, the description of the method of forming the above-described n-type CIS film and p-type CIS film is exemplary, and the present invention is not limited thereto.

A CIS thin film formed using the above-described method has different conductivity according to a relative ratio of the first alloy and the second alloy. When the relative ratio of the first alloy to the second alloy, for example, the mole ratio of $In_2Se_3/Cu_2Se_3$, is in a range of 0.1 to 0.5 (that is, $0.1 \leq$ mole ratio of $In_2Se_3/Cu_2Se_3 \leq 0.5$), the CIS thin film has a p-type conductivity. On the other hand, when the mole ratio of $In_2Se_3/Cu_2Se_3$ is in a range of 0.6 to 0.9 ($0.6 \leq$ mole ratio of $In_2Se_3/Cu_2Se_3 \leq 0.9$), the CIS thin film has an n-type conductivity. Therefore, as the relative amount of $In_2Se_3$ increases, a tendency for the CIS thin film to be an n-type semiconductor is increased. Also, as the amount of $Cu_2Se_3$ increases, a tendency for the CIS thin film to be a p-type semiconductor is increased. Accordingly, the type and concentration of a carrier of the formed thin film varies. As described above, experimental values with regard to the type and concentration of the CIS carrier formed according to the mole ratio of $In_2Se_3/Cu_2Se_3$ are shown in Table 1.

TABLE 1

| serial number | mole ratio of $In_2Se_3/Cu_2Se_3$ | doping type | Concentration of carrier |
|---|---|---|---|
| 1 | 0.75 | n-type | $-5 \times 10^{11}$ |
| 2 | 0.6 | n-type | — |
| 3 | 0.5 | p-type | $+5.2 \times 10^{16}$ |
| 4 | 0.33 | p-type | $+7 \times 10^{16}$ |

In an electro-medical imaging apparatus of the present invention, a signal absorption layer absorbing X-ray signals is formed with chalcogen materials such as Se, CdTe, CdZnTe, or the like, and a TFT consisting of a signal storage unit, which stores X-ray information, is formed of chalcogen materials such as GST, CIS, or the like.

According to the electro-medical imaging apparatus of the present invention, X-rays are irradiated onto a medium of which the inside is intended to be seen using a fluoroscope, and displayed on a display according to the energy of the X-rays, which is changed by the medium, and can be displayed as a digitalized image signal by performing digital image signal processing. Accordingly, since it is unnecessary to use an X-ray film, costs can be reduced significantly. Also, chalcogen materials sensitively reacting to X-rays are used, and thus, it is possible to increase the preciseness of the fluoroscopy imaging technique.

In a method of manufacturing the electro-medical imaging apparatus, the TFT can be formed by performing a low temperature process and can use a low-priced glass substrate. Also, an injection process is unnecessary in the method of manufacturing the electro-medical imaging apparatus, and thus, is economical.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electro-medical imaging apparatus, comprising:
    a signal generating unit where electron-hole pairs are formed by absorbing an optical energy irradiated from outside;
    a power source contacting a surface of the signal generating unit and applying an electric signal so as to separate the electron-hole pairs to be accumulated each in opposite sides of the signal generating unit according to their polarities;
    a signal storage unit connected to the signal generating unit and receiving and storing one of the separated charges; and
    a signal converter connected to the signal storage unit and applying a control signal to the signal storage unit to convert an electric signal, generated by the charges stored in the signal storage unit, into an image signal, wherein the signal storage unit comprises:
a blocking layer allowing the inflow of only one kind of charge separated in the signal generating unit;
a second electrode electrically contacting the blocking layer;
a device layer electrically contacting the second electrode and comprising a plurality of unit cells, each of which consists of a capacitor and a transistor connected to the capacitor, wherein the capacitor stores one kind of charge that flows through the blocking layer; and
a substrate where the blocking layer, the second electrode, and the device layer are formed,
wherein the transistor disposed in the device layer comprises an active CIS layer formed with In2Se3 and Cu,Se3.

2. The electro-medical imaging apparatus of claim 1, wherein the signal generating unit, the signal storage unit, and the signal converter are a structure having sequentially stacked layers.

3. The electro-medical imaging apparatus of claim 1, wherein the signal generating unit comprises:
a first electrode electrically connected to the power source so that the electric signal of the power source is applied to the signal generating unit;
an insulating layer formed in a lower surface of the first electrode and blocking charges flowing from the power source; and
an absorption layer formed in a lower surface of the insulating layer and absorbing an optical energy irradiated from outside to generate electron-hole pairs, wherein the electron-hole pairs are separated from each other by the electric signal applied from the power source to be accumulated each in opposite sides.

4. The electro-medical imaging apparatus of claim 3, wherein the absorption layer comprises chalcogen.

5. The electro-medical imaging apparatus of claim 4, wherein the absorption layer comprises pure amorphous selenium (Se).

6. The electro-medical imaging apparatus of claim 4, wherein the absorption layer comprises CdTe or CdZnTe.

7. The electro-medical imaging apparatus of claim 1, wherein the substrate comprises glass or quartz.

8. The electro-medical imaging apparatus of claim 1, wherein the unit cell further comprises one or more electrical unit devices.

9. The electro-medical imaging apparatus of claim 1, wherein the device layer comprises two-dimensional arrays in which a plurality of the unit cells are arranged in horizontal and vertical directions, respectively.

10. The electro-medical imaging apparatus of claim 1, wherein the transistor disposed in the device layer comprises:
the active layer formed on the substrate;
source and drain electrodes respectively formed at both sides of the active layer;
a gate insulating layer formed on the active layer; and
a gate electrode formed on the gate insulating layer.

11. The electro-medical imaging apparatus of claim 10, wherein a conductive type of the active layer varies according to a relative mole ratio of $In_2Se_3$ and $Cu_2Se_3$.

12. The electro-medical imaging apparatus of claim 11, wherein, when the relative mole ratio of $In_2Se_3$ and $Cu_2Se_3$ is in a range of 0.1 to 0.5, the CIS film has a p-type conductivity.

13. The electro-medical imaging apparatus of claim 11, wherein, when the relative mole ratio of $In_2Se_3$ and $Cu_2Se_3$ is in a range of 0.6 to 0.9, the CIS film has an n-type conductivity.

14. The electro-medical imaging apparatus of claim 1, wherein the transistor disposed in the device layer comprises:
a gate electrode formed on a portion of the substrate;
an insulating layer covering the substrate and the gate electrode;
the active layer formed on the insulating layer so as to cover a region where the gate electrode is formed; and
source and drain electrodes respectively formed at both sides of the active layer.

15. The electro-medical imaging apparatus of claim 14, wherein a conductive type of the active layer varies according to a relative mole ratio of $In_2Se_3$ and $Cu_2Se_3$.

16. The electro-medical imaging apparatus of 15, wherein, when the relative mole ratio of $In_2Se_3$ and $Cu_2Se_3$ is in a range of 0.1 to 0.5, the CIS film has a p-type conductivity.

17. The electro-medical imaging apparatus of claim 15, wherein, when the relative mole ratio of $In_2Se_3$ and $Cu_2Se_3$ is in a range of 0.6 to 0.9, the CIS film has an n-type conductivity.

18. The electro-medical imaging apparatus of claim 1, wherein the signal converter comprises:
a signal applying circuit unit applying a control signal to a transistor in the signal storage unit;
a signal amplification device amplifying an electric signal transmitted from the transistor generated by the control signal;
a multiplexer multiplexing the signal amplified in the signal amplification device; and
an analog-to-digital converter (ADC) converting the multiplexed signal into a digital signal.

* * * * *

UNITED STATES PATENT AND TRADEMARK OFFICE
CERTIFICATE OF CORRECTION

PATENT NO. : 7,687,779 B2  Page 1 of 1
APPLICATION NO. : 12/023822
DATED : March 30, 2010
INVENTOR(S) : Sang Su Lee et al.

It is certified that error appears in the above-identified patent and that said Letters Patent is hereby corrected as shown below:

On the Title page, Item 75 (Inventors), line 1 and line 2, please change "Kobong Song, Daejeon (KR)" to -- Kibong Song, Daejeon (KR) --.

Signed and Sealed this

Eleventh Day of May, 2010

David J. Kappos
*Director of the United States Patent and Trademark Office*